United States Patent [19]
Rubens et al.

[11] Patent Number: 5,960,535
[45] Date of Patent: Oct. 5, 1999

[54] HEAT CONDUCTIVE SUBSTRATE PRESS-MOUNTED IN PC BOARD HOLE FOR TRANSFERRING HEAT FROM IC TO HEAT SINK

[75] Inventors: Paul A. Rubens, Salem; Charlie W. Gilson, Philomath; Brian G. Spreadbury, Corvallis; Horst F. Irmscher, Corvallis; Tim J. Jondrow, Corvallis, all of Oreg.

[73] Assignee: Hewlett-Packard Company, Palo Alto, Calif.

[21] Appl. No.: 08/958,954

[22] Filed: Oct. 28, 1997

[51] Int. Cl.⁶ ....................................................... H05K 3/30
[52] U.S. Cl. ................................. 29/832; 29/832; 29/830; 361/719; 257/691; 174/16.3
[58] Field of Search ..................... 29/830, 832; 174/16.3; 361/386, 719, 705; 257/720

[56] References Cited

U.S. PATENT DOCUMENTS

| | | |
|---|---|---|
| 4,602,314 | 7/1986 | Broadbent . |
| 4,649,460 | 3/1987 | Marchisi et al. . |
| 4,731,693 | 3/1988 | Berg et al. ................................ 361/386 |
| 4,750,089 | 6/1988 | Derryberry et al. . |
| 4,849,856 | 7/1989 | Funari et al. . |
| 5,172,301 | 12/1992 | Schneider ................................ 361/386 |
| 5,229,918 | 7/1993 | Della Bosca et al. . |
| 5,278,724 | 1/1994 | Angulas et al. . |
| 5,291,372 | 3/1994 | Matsumoto . |
| 5,375,039 | 12/1994 | Wiesa . |
| 5,410,451 | 4/1995 | Hawthorne et al. . |
| 5,578,869 | 11/1996 | Hoffman et al. . |
| 5,617,294 | 4/1997 | Watson et al. ........................... 361/719 |
| 5,825,625 | 10/1998 | Esterberg et al. ....................... 361/719 |

FOREIGN PATENT DOCUMENTS

| | | |
|---|---|---|
| 0103068 | 3/1984 | European Pat. Off. . |
| 1248543 | 10/1989 | Japan . |
| 0279451 | 3/1990 | Japan . |
| 0448740 | 2/1992 | Japan . |

*Primary Examiner*—Lee Young
*Assistant Examiner*—Sean P. Smith
*Attorney, Agent, or Firm*—Timothy F. Myers; Curtis G. Rose

[57] ABSTRACT

A heat conductive substrate is mounted within a through-opening of a printed circuit board. An integrated circuit then is mounted to one side of the heat conductive substrate, while a heat sink is fixed in thermal contact to the other side of the substrate. There is no direct thermal contact between the IC and the PC board. The heat conductive substrate is mounted to the PC board by applying a controlled pressure to normal surfaces of multiple portions of the substrate. Such pressure reducing the thickness and expands the area of the pressed portions locking the substrate to the PC board. An air gap occurs between the substrate and the PC board everywhere except for the pressed regions of the substrate. Such pressed regions occur along the periphery of the substrate.

11 Claims, 4 Drawing Sheets

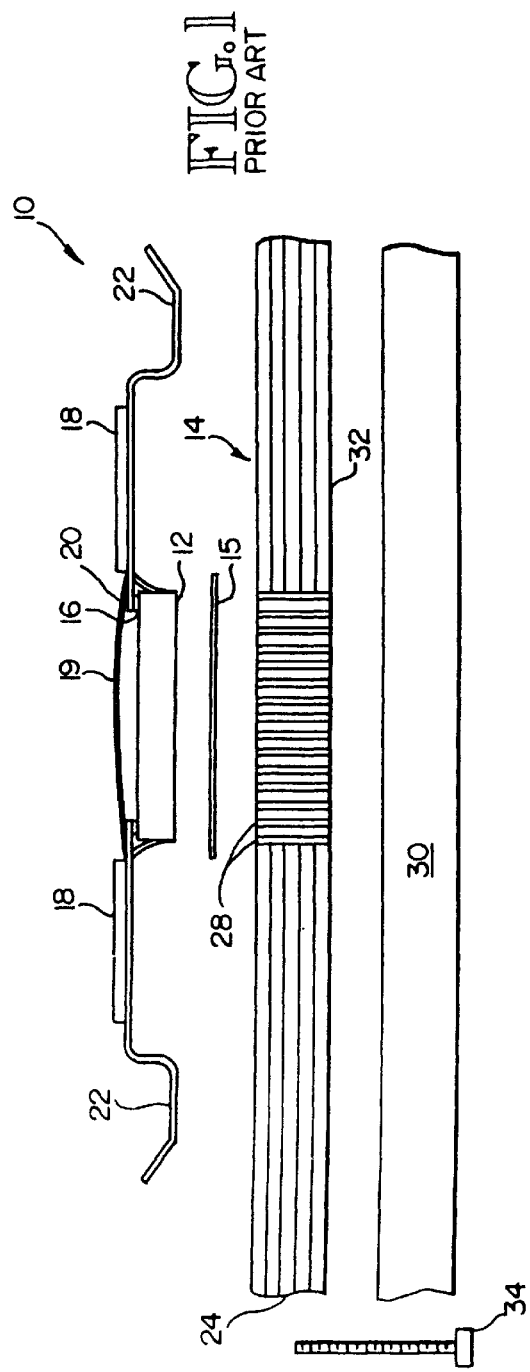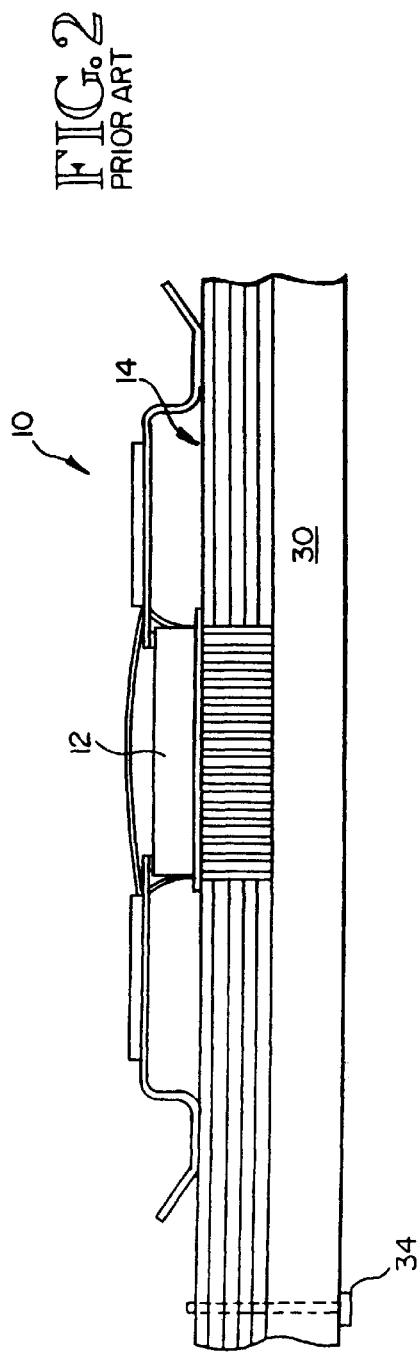

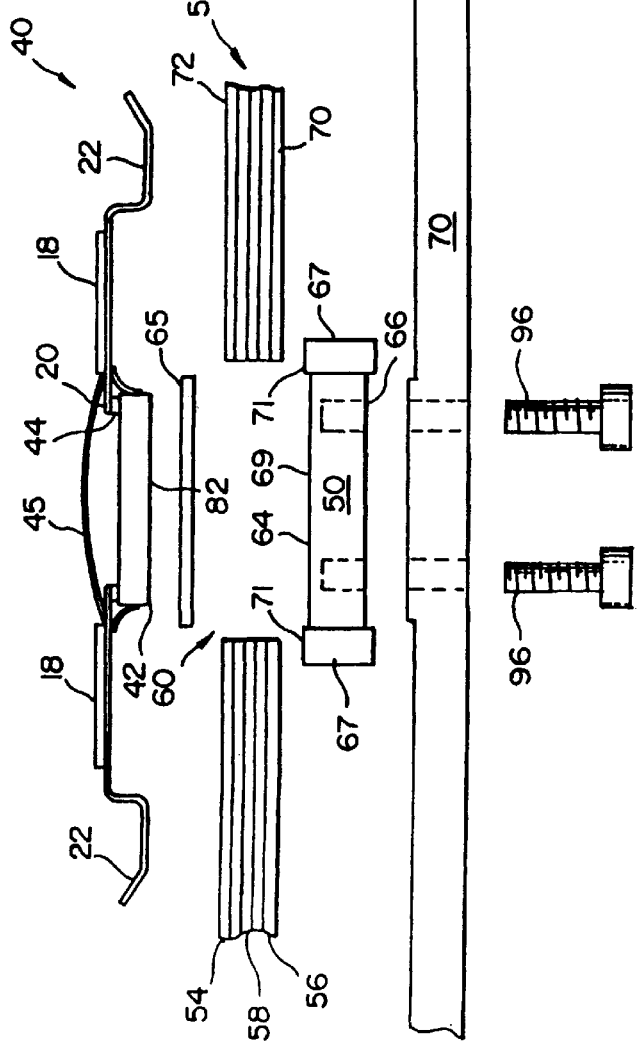
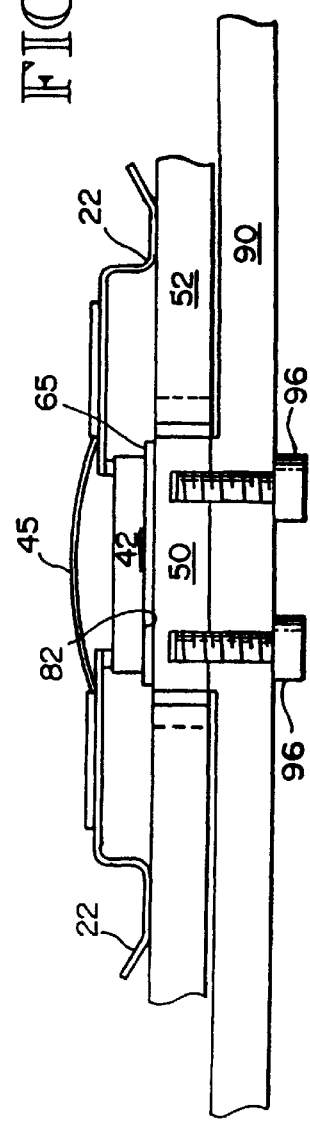

HEAT CONDUCTIVE SUBSTRATE PRESS-MOUNTED IN PC BOARD HOLE FOR TRANSFERRING HEAT FROM IC TO HEAT SINK

BACKGROUND OF THE INVENTION

This invention relates generally to a substrate for dissipating heat from an integrated circuit device, and more particularly, to a method for mounting such a substrate to a PC board.

As integrated circuits ("ICs"), and in particular, microprocessors are designed to run at increasing speeds, such circuits consume more power and generate more heat. Such heat needs to be dissipated to maintain the integrated circuit and nearby circuits within rated operating temperature ranges. Conventionally, this is done by coupling the IC's to heat sinks and blowing air using cooling fans. In addition, some faster microprocessor chips, such as some Pentium™ microprocessor models, have increased maximum temperature tolerances to 95° C. Although such chips can withstand increased and relatively high operating temperatures, neighboring IC's can not The neighboring chips are often limited to conventional maximum operating temperatures of approximately 70° C. With the microprocessor in close proximity to these less tolerant components, some of the microprocessor's heat tends to flow into the printed circuit ("PC") board and to such components. Of concern is the overheating of the surrounding components. To avoid damage to the less tolerant components in the vicinity of the heat generating microprocessor, it is known to throttle back the microprocessor's speed when peak operating temperatures are sensed. Reducing the speed causes the microprocessor to generate less heat. It also means, however, that the customer's product is not operating as fast as expected. Accordingly, there is an ongoing need for transferring heat away from the microprocessor without unduly heating neighboring components and without compromising processor speed.

A conventional heat transfer method uses copper-lined vias in a PC board to transfer heat from the microprocessor to a heat sink. Copper is a good conductor of heat. The microprocessor is mounted to the PC board providing a thermal contact between the microprocessor and the copper walls of the vias. A heat sink typically is mounted to the underside of the PC board. Heat from the microprocessor then is conducted along the copper walls away from the microprocessor to the heat sink. A shortcoming of such approach is that heat conducted along the copper walls of the vias travels, not only to the heat sink, but also into the several copper layers of the PC board. The PC board typically includes a plurality of copper layers for electrically interconnecting the multiple IC chips on the PC board. Such copper layers border the via at the copper lining. Thus, undesirably effective heat transfer paths also occur between the microprocessor and nearby devices.

Another shortcoming of conventional heat transfer solutions relates to the microprocessor surface mounting process. To enhance thermal conductivity between a microprocessor and the PC board vias, the region where the microprocessor is to be placed typically is covered with solder. During the surface mounting process, the solder becomes liquid. Then, when resolidifying, the solder defines a heat conductive bridge from microprocessor to PC board. Unfortunately the solder mounds up in areas resulting in a very uneven surface. The non-planar solder interface between microprocessor and PC board reduces the thermal transfer effectiveness of the bridge. Accordingly, there is need for a more effective chip mounting technique, and a more effective thermal contact.

SUMMARY OF THE INVENTION

According to the invention, a heat conductive substrate is mounted within a through-opening of a printed circuit ("PC") board. An integrated circuit then is mounted to one side of the heat conductive substrate, while a heat sink is in thermal contact to the other side. In particular the integrated circuit is not mounted into thermal contact with the PC board. With no direct thermal contact between the IC and the PC board one thermal transfer path between the IC and neighboring circuits is eliminated.

According to one aspect of the invention, the heat conductive substrate includes a first portion having a first thickness which is approximately the same thickness as the PC board to which the substrate is to be mounted. In addition the substrate includes a plurality of second portions spaced along the periphery of the substrate. Each one of the second portions has a second thickness greater than the thickness of the first portion. Thus, the periphery of the substrate includes portions at the second thickness and other portions at the first thickness.

According to another aspect of this invention, the PC board has a through-opening of approximately the same shape as the periphery of the substrate. The through-opening, however, has an area slightly larger than the area of substrate. The substrate does not touch the printed circuit board when initially positioned in the through-opening. More particularly, there is a gap between the substrate and the PC board.

According to another aspect of the invention, the substrate is mounted to the PC board by applying a controlled pressure to normal surfaces of the second portions of the substrate. Such pressure displaces the material in the second portions, in effect reducing the thickness and expanding the area of the second portions. In a preferred embodiment the second portions are compressed to the same thickness as the first portion of the substrate. Such compression displaces the material in the second portions into the gap between the second portions and the PC board, and into contact with the PC board. In effect, the areas of the second portions has expanded across the gap to lock the substrate to the PC board. Note that contact between the substrate and PC board is established along the periphery of the substrate only at the second portions and not at the first portion. Once the substrate is locked in place, there is an air gap between the heat conductive substrate and the layers of the PC board everywhere except for the second regions of the substrate.

According to another aspect of the invention, the electrically conductive layers of the PC board are isolated from the portions of the PC board through-opening which receives the substrate second portions. In a preferred embodiment, the electrically conductive layers of the PC board are isolated from the entire through-opening. The walls of the through-opening are thermally insulated.

According to another aspect of the invention, an integrated circuit is mounted on one side of the substrate. In a preferred embodiment an adhesive is used for such mounting to provide a smooth co-planar contact. The co-planar contact provides a continuous, effective heat transfer bridge from IC to substrate. According to another aspect of the invention, a heat sink is in thermal contact to an underside of the substrate.

One advantage of the invention is that heat conductivity between a given integrated circuit, such as a high speed microprocessor, and neighboring circuits is reduced. Another advantage is that an effective heat transfer path is established between a given integrated circuit and a heat sink. Another advantage is that an effective thermal contact is established between a given integrated circuit package and the substrate.

An advantage of the mounting method is the rapidness and ease for mounting the substrate. The pressing of the second portions is quickly and effectively implemented as automated installation process, compared to a slower solder-mounting process. Further the avoidance of solder-mounting avoids the need to include added area to the substrate for such a solder connection and trades a solder-contact rim for the second region contact peripheries. This results in comparatively less contact area between the substrate and the PC board and a thinner substrate approximating that of the PC board. The thinner substrate reduces the length of the heat transfer path from integrated circuit across the substrate to a heat sink. These and other aspects and advantages of the invention will be better understood by reference to the following detailed description taken in conjunction with the accompanying drawings.

BRIEF DESCRIPTION OF THE DRAWINGS

FIG. 1 is an exploded cross-sectional view of a PC board, integrated circuit and heat sink configured to implement a conventional heat transfer method between the integrated circuit and heat sink;

FIG. 2 is a cross-sectional view of the PC board, integrated circuit and heat sink of FIG. 1;

FIG. 5 is an exploded partial view of a PC board, integrated circuit, heat conductive substrate and heat sink configured to implement heat transfer according to an embodiment of this invention;

FIG. 8 is a cross-sectional view of the PC board, integrated circuit, heat conductive substrate and heat sink of FIG. 5 as assembled.

DESCRIPTION OF SPECIFIC EMBODIMENTS

Figure 3:
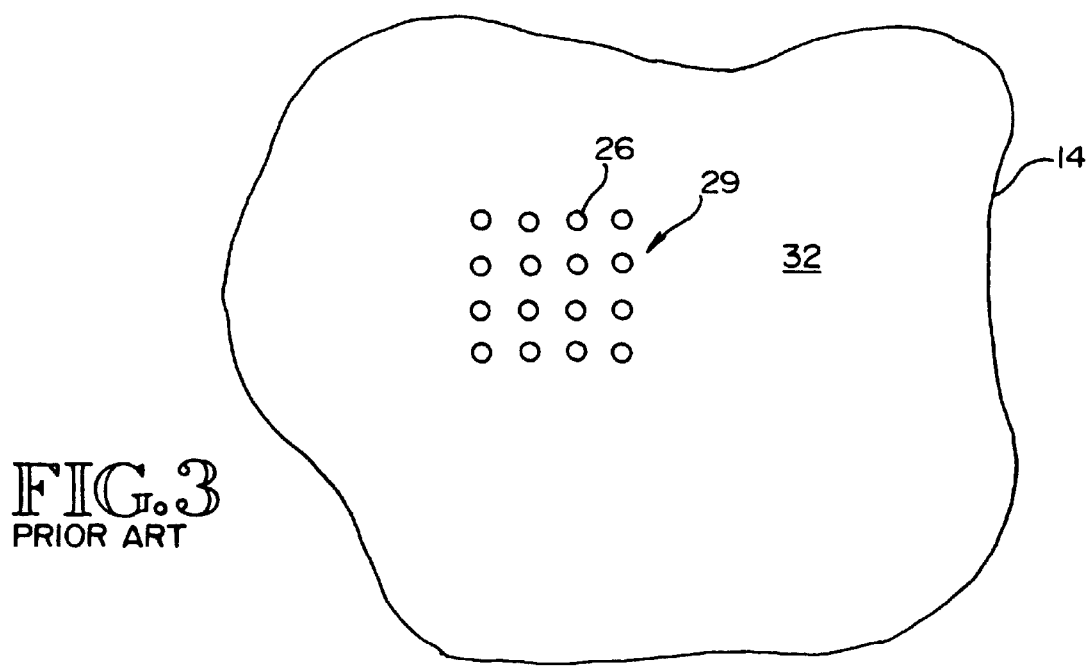
FIG. 3 is a partial view of an undersurface of the PC board of FIG. 1.

FIGS. 1 and 2 show a conventional heat dissipation structure 10 for transferring heat away from a high speed microprocessor integrated circuit 12. The microprocessor 12 is mounted to a multi-layer PC board 14, typically by thermal mounting tape 15, or by another surface mounting technique. The microprocessor includes contacts 16 for enabling electrical interfacing to other integrated circuits, devices and signal paths. Typically a polyamide structure 18 maps contact connections between the microprocessor 12 and PC board traces. The polyamide structure 18 includes inner leads 20 compression mounted to the microprocessor contacts 16 and outer leads 22 soldered to the PC board traces. The polyamide structure 18 has internal circuit paths which are mapped to provide desired path connections between a given inner lead 20 (and thus a desired microprocessor contact 16) and a given outer lead 22 (and thus a desired PC board trace). An encapsulant 19 typically is applied to the microprocessor 12 at a surface adjacent to the polyamide structure.

The PC board includes multiple layers 24 for defining PC signal path traces for interconnecting the microprocessor 12 and other integrated circuits mounted to the PC board 14. The PC board 14 includes multiple vias 26 in the area where the microprocessor is mounted (see FIG. 3). The vias 26 are shown at an exaggerated diameter for purposes of illustration. A typical via has a diameter of approximately 14 mils (0.014 inches). Although an array 29 of only 4×4 vias 26 are shown, conventionally there are approximately 100 underlying a microprocessor undersurface that extends 0.5 inches on each side. The vias have copper lined walls 28 (se FIGS. 1 and 2) which serve as heat transfer conductors. A heat sink 30 is held to an undersurface 32 of the PC board 14 in the region of the vias 26. Typically, mounting screws 34 are used to hold the heat sink 30 to the PC board 14. Heat is conducted away from the microprocessor 12 along the copper walls 28 to the heat sink 30. Such copper walls 28, however, also are in intimate thermal contact with the PC board layers 24. Conductive signal paths formed within the PC board layers 24 also are formed of copper or another effective heat conductor. Accordingly, there also are heat transfer paths conducting the microprocessor heat toward other integrated circuits in the vicinity of the microprocessor. This is undesirable because these other integrated circuits typically are not as tolerant of increased operating temperatures as the microprocessor, and/or do not have heat sinks in proximate thermal communication.

Figure 4:
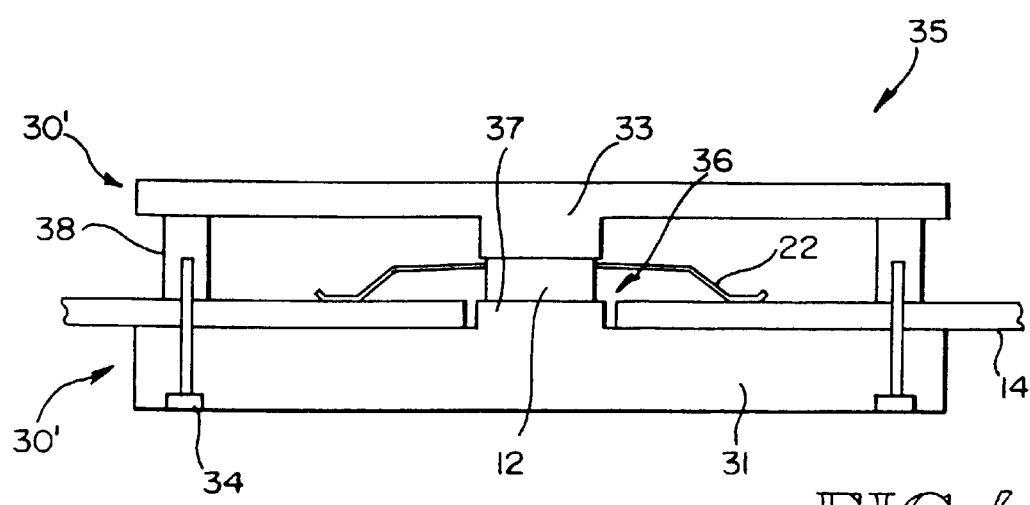
FIG. 4 is a cross-sectional view of a PC board, integrated circuit and two-piece heat sink configured to implement another conventional heat transfer method between the integrated circuit and heat sink.

FIG. 4 shows another conventional heat dissipation structure 35 for transferring heat away from a high speed microprocessor integrated circuit 12. A heat sink 30' having two sections 31, 33 sandwiches the microprocessor 12 to transfer heat away from the microprocessor 12. A lower section 31 is in thermal contact with a lower surface of the microprocessor, while an upper section 33 is in thermal contact with an upper surface of the microprocessor. The PC board 14 for the microprocessor 12 has an opening 36 into which a portion 37 of a heat sink section 31 extends. The heat sink portion 37 fills the opening 36. The microprocessor 12 is mounted to the lower heat sink section 31 via thermal mounting tape. The heat sink upper section 33 includes legs 38. The upper section 33 is fastened to the heat sink lower section 31 via mounting screws 34 extending through the PC board 14 into the legs 38.

To assemble the structure 35, the microprocessor 12 is mounted to the PC board 14 via a polyamide structure with leads 22. Next, thermal mounting tape is applied and the lower section 31 of the heat sink 30' is inserted into contact with the microprocessor 12 via the contact tape. Lastly, the upper section 33 is applied and fastened to the lower section 33. A disadvantage of this heat transfer structure 35 and assembly method is that the microprocessor 12 is mounted to the heat sink. Thus, the heat sink 30' has to be installed contemporaneously with the microprocessor 12. Otherwise the microprocessor is left unsupported over the opening 36 in the PC board. Such a position leaves the microprocessor 12 vulnerable to damage in response to any sudden jarring motions. As a result, the heat sink 30' is installed when the microprocessor 12 is installed. The bulkiness of the heat sink 30' however makes mounting other components on the PC board more difficult.

Heat Dissipation Structure Embodiments

Figure 6:
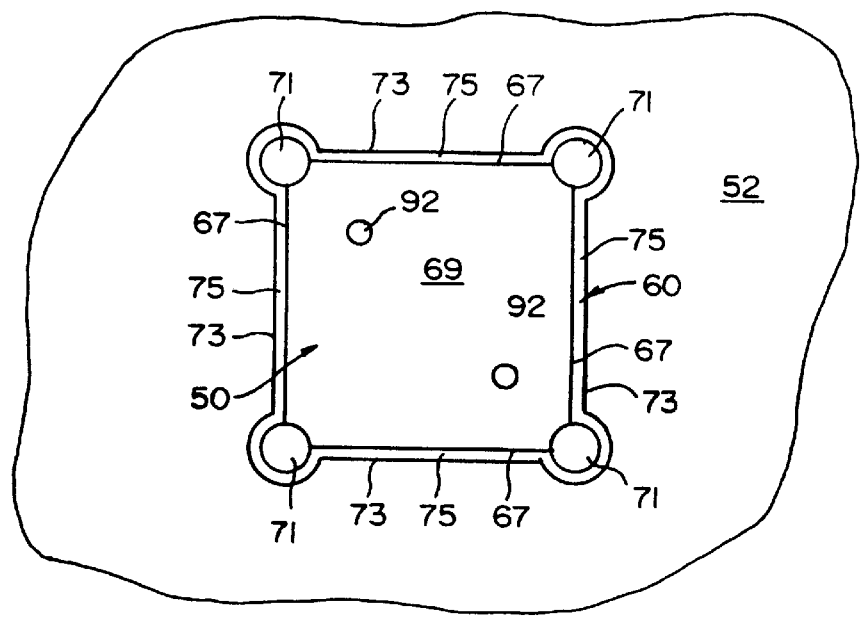
FIG. 6 is a planar view of the heat conductive substrate and a portion of the PC board of FIG. 5 prior to installation.

FIGS. 5 and 6 show a heat dissipation configuration 40 for conducting heat away from an integrated circuit ("IC") 42 according to an embodiment of this invention. The IC 42 is a microprocessor or other heat generating IC. Shown is an IC 42 having protruding tape automated bonding ("TAB") contacts 44. ICs having other lead configurations or special package enclosures also are encompassed by the heat dissipation scheme of this invention. A polyamide structure 18 maps contact connections between the microprocessor 42 and PC board traces. The polyamide structure 18 includes inner leads 20 compression mounted to the microprocessor contacts 44 and outer leads 22 soldered to the PC board traces. The polyamide structure 18 has internal circuit paths which are mapped to provide desired path connections between a given inner lead 20 (and thus a desired microprocessor contact 44) and a given outer lead 22 (and thus a desired PC board trace). An encapsulant 45 is applied to the microprocessor 12 at a surface adjacent to the polyamide structure 18.

The IC 42 is mounted at its undersurface 82 to a heat conductive substrate 50 via thermal mounting tape 65. In a preferred embodiment the substrate 50 is made of copper or silver. The substrate 50 is mounted to a multi-layer printed circuit ("PC") board 52. The PC board includes an upper layer 54, a bottom layer 56 and one or more intermediary layers 58. Typically each layer 54–58 is an electrically insulative layer with various electrically-conductive signal paths formed therein. The PC board 52 defines an opening 60 extending all the way through the board.

The substrate 50 is mounted to the PC board 52 to extend into the opening 60. As shown in FIG. 5, prior to installation the substrate 50 includes a first portion 69 having a first thickness and a plurality of second portions 71 having a second thickness. In a preferred embodiment the first thickness is equal to or approximately equal to the thickness of the PC board 52. The second thickness is greater than the first thickness. Each one of the plurality of second portions 71 occurs along the periphery of the substrate 50. The substrate 50 has a first surface 64 and a second surface 66, along with side edges 67 extending the periphery of the substrate 50. Such first surface 64 and second surface 66 occur at both the first portion 69 and second portions 71 of the substrate 50. The first surfaces 64 of portions 71, however, are elevated relative to the first surface 64 of portion 69. Similarly, the second surfaces 66 of portions 71 are elevated relative to the second surface 66 of portion 69. The area of the first surface is equal to the area of the second surface. In addition, the area of the first surface is less than the area of the through-opening 60.

FIG. 6 shows an exemplary embodiment of the substrate 50 and PC board 52 with through-opening 60. Prior to installation the substrate 50 fits into and through the through-opening 60 of PC board 52. In particular walls 73 of the PC board 52 define the through-opening 60 to have a contour the same or similar to the peripheral contour of the substrate 50. Thus, when the substrate 50 is initially placed within the through-opening 60 there is an air gap 75 between the substrate peripheral edges 67 and the walls 73 of the through-opening 60. Such air gap occurs along the entire periphery of the substrate 50 for the entire depth of the through-opening 60. In one embodiment the air gap is 0.01 inches wide, although such width may vary according to other embodiments. In a preferred embodiment the volume of the substrate 50 is less than the volume of the through-opening 60 both prior to and after installation and mounting of the substrate 50.

Figure 7:
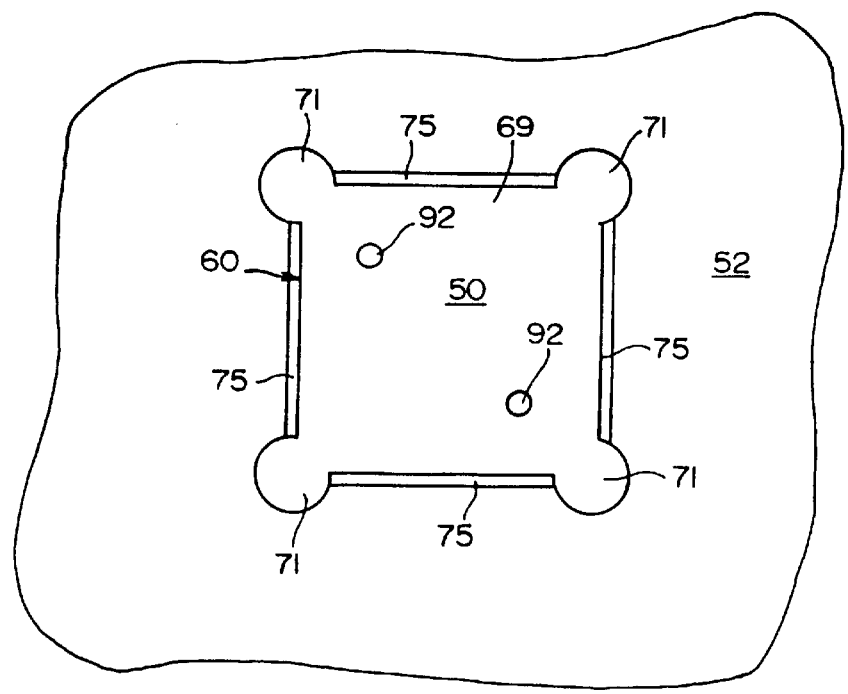
FIG. 7 is a planar view of the heat conductive substrate and a portion of the PC board of FIG. 5 after installation.

With the substrate 50 situated within the through-opening 60, the substrate is mounted by applying force to the first surface 64 and second surface 66 of the respective second portions 71. Such force is sufficient to deform the substrate second portions 71. Specifically, the second portions are pressed reducing the original second thickness of the second portions 71 to be the same or approximately the same as the thickness of the first portion 69. Such pressing causes the second portions 71 to expand into the respective air gap 75 portions surrounding the second portions 71. Further, the second portions 71 expand into contact with the walls 73 of the through-opening 60 adjacent to the second portions 71. Such expansion of the second portions 71 is sufficient to lock the substrate 50 into the through-opening 60. FIG. 7 shows the substrate 50 locked into the through-opening 60 of the PC board 52. Note that there is still an air gap 75 between the substrate edges 67 and through-opening walls 73 along a portion of the substrate periphery. Such periphery portion are the edges 67 of the first portion 69. With the substrate 50 locked in place, the area and volume of the substrate is less than the area and volume of the through-opening 60. In an alternative embodiment the substrate 50 first thickness is greater than the thickness of the PC board. When such substrate is mounted the substrate protrudes from the through-opening 60 and may have a volume greater than that of the through-opening 60. The planar area of the through-opening (such plane being the planar area from the orientation of FIGS. 6 and 7), however, is larger than the planar area of the first surface 64 or the second surface 66 in each embodiment.

In one embodiment the PC board is formed of layers of insulative material with conductive lines within one or more of such layers. According to a preferred embodiment, the conductive lines do not extend to or along the through-opening walls 73. Such walls are formed by a base fiberglass material of the PC board or another thermally insulative material. An advantage of the electrically insulative walls 73 is that shorts do not occur between the PC board and the substrate 50. An advantage of the thermally insulative walls 73 is that PC board components near the opening are not significantly impacted by the heat flow from the IC 42 to the substrate 50.

A heat sink 90 is mounted to the substrate 50 as shown in FIG. 8. In one embodiment the substrate 50 has threaded openings 92 for receiving screws 96 which hold the heat sink to the substrate. The heat sink 90 extends over the same or a larger area than the substrate 50. Preferably, the heat sink 90 is spaced away from the PC board undersurface 70. In some embodiments the heat sink 90 is anchored to the undersurface 70 of the PC board 52, while being spaced from the PC board by a thermally insulating spacer (not shown).

Meritorious and Advantageous Effects

The substrate 50 serves as an effective heat transfer path for conducting heat away from the IC 42 to a heat sink 90. Because the IC 42 is mounted to the substrate there is no direct heat conduction from the IC 42 into the PC board 52. By mounting the IC 42 to the substrate, one conventional heat transfer path from IC to PC board is eliminated. By defining an air gap 80 between the substrate 50 and the PC board 52 layers 54, 58 other potential heat transfer paths are avoided.

One advantage of the invention is that heat conductivity between a given integrated circuit, such as a high speed microprocessor, and neighboring circuits is reduced. Another advantage is that an effective heat transfer path is established between a given integrated circuit and a heat sink. Another advantage is that an effective thermal contact is established between a given integrated circuit and the substrate.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method of mounting a substrate into a through-opening of a PC board, comprising the steps of:

inserting the substrate into the PC board through-opening, wherein a gap within the through-opening of the PC board occurs between the PC board and the substrate, and wherein the substrate has a first portion having a first thickness and a second portion having a second thickness, the second thickness greater than the first thickness;

applying a pressure to the second portion of the substrate, wherein the second portion reduces thickness and expands across the gap into contact with the PC board.

2. The method of claim 1, in which before the step of applying pressure, the gap within the through-opening of the PC board occurs between the PC board and the substrate along an entire periphery of the substrate.

3. The method of claim 2, in which after the step of applying pressure, the gap within the through-opening of the PC board occurs between the PC board and the substrate along less than the entire periphery of the substrate.

4. A method for forming a heat transfer path between an integrated circuit and a heat sink, comprising the steps of:

press-mounting a heat conductive substrate within a through-opening of a PC board;

fixing the integrated circuit into thermal contact with a first surface area of the substrate, the integrated circuit having an underlying surface area, the substrate first surface area being at least as large as the integrated circuit underlying surface area; and mounting the heat sink into thermal contact with the substrate without forming direct thermal contact between the heat sink and the PC board.

5. The method of claim 4, in which the step of press-mounting comprises the steps of:

inserting the substrate into the PC board through-opening, wherein a gap within the through-opening of the PC board occurs between the PC board and the substrate, and wherein the substrate has a first portion having a first thickness and a second portion having a second thickness, the second thickness greater than the first thickness; and applying pressure to the second portion of the substrate, wherein the second portion reduces thickness and expands across the gap into contact with the PC board.

6. The method of claim 5, in which before the step of applying pressure, the gap within the through-opening of the PC board occurs between the PC board and the substrate along an entire periphery of the substrate.

7. The method of claim 6, in which after the step of applying pressure, the gap within the through-opening of the PC board occurs between the PC board and the substrate along less than the entire periphery of the substrate.

8. The method of claim 4, in which the through-opening of the PC board is defined by walls, and wherein the walls of the through-opening which receive physical contact with the substrate are thermally insulated.

9. The method of claim 4, wherein after the step of mounting the substrate has a volume less than a volume of the through-opening.

10. The method of claim 4, wherein after the step of mounting, the substrate has an area less than an area of the through-opening.

11. The method of claim 5, in which the gap is an air gap.

* * * * *